United States Patent [19]

Criegern et al.

[11] Patent Number: 4,645,929
[45] Date of Patent: Feb. 24, 1987

[54] METHOD AND APPARATUS FOR THE COMPENSATION OF CHARGES IN SECONDARY ION MASS SPECTROMETRY (SIMS) OF SPECIMENS EXHIBITING POOR ELECTRICAL CONDUCTIVITY

[75] Inventors: Rolf V. Criegern, Geretsried; Ingo Weitzel, Taufkirchen, both of Fed. Rep. of Germany

[73] Assignee: Siemens Aktiengesellschaft, Berlin and Munich, Fed. Rep. of Germany

[21] Appl. No.: 696,774

[22] Filed: Jan. 31, 1985

[30] Foreign Application Priority Data

Jan. 31, 1984 [DE] Fed. Rep. of Germany ....... 3403254

[51] Int. Cl.$^4$ ............................................. G01N 23/00
[52] U.S. Cl. .................................... 250/307; 250/306; 250/309
[58] Field of Search ................ 250/306, 307, 309, 310

[56] References Cited

U.S. PATENT DOCUMENTS

| | | | |
|---|---|---|---|
| 3,219,817 | 11/1965 | Möllenstedt | 250/309 |
| 3,517,191 | 6/1970 | Liebl | 250/309 |
| 3,878,392 | 4/1975 | Yew et al. | 250/309 |
| 4,249,077 | 2/1981 | Crawford | 250/306 |
| 4,420,686 | 12/1983 | Onaguchi et al. | 250/306 |

*Primary Examiner*—Bruce C. Anderson
*Attorney, Agent, or Firm*—Hill, Van Santen, Steadman & Simpson

[57] ABSTRACT

A method and an apparatus are provided for the compensation of charges in the secondary ion mass spectrometry of specimens exhibiting poor electrical conductivity. A scanning ion gun and an electron gun allow secondary ion mass spectra specimens exhibiting poor electrical conductivity to be registered under better-defined conditions than heretofore possible. The electron beam of the electron gun is focused to approximately the same diameter as the ion beam and impinges approximately the same point on the surface of the specimen as the ion beam.

14 Claims, 4 Drawing Figures

1mm

1mm

METHOD AND APPARATUS FOR THE COMPENSATION OF CHARGES IN SECONDARY ION MASS SPECTROMETRY (SIMS) OF SPECIMENS EXHIBITING POOR ELECTRICAL CONDUCTIVITY

BACKGROUND OF THE INVENTION

1. Field of the Invention

The present invention relates to a method for the compensation of charges in secondary ion mass spectrometry (SIMS) of specimens exhibiting poor electrical conductivity using a scanning ion gun and an electron gun, and also relates to an apparatus for carrying out the method in which the ion gun and the electron gun share a common scan generator.

2. Description of the Prior Art

In the analysis technique of secondary ion mass spectrometry (SIMS) the specimen to be investigated with respect to its elemental composition is bombarded with an ion beam (for example, oxygen $O_2^+$, 1-15 keV, 1 nA--10 $\mu$A) and is thereby slowly eroded (a sputtering process). The atoms and molecule fragments thereby released (sputtered off) from the specimen surface can, insofar as they are electrically charged ("secondary ions"), be guided into a mass spectrometer, be separated there according to their mass-charge ratio m/e and be detected and counted with the assistance of a multiplier or the like.

In order to achieve a uniform erosion of the specimens over the area to be analyzed, the ion beam is generally focused onto the specimen surface and is scanned line-by-line across the area that is to be eroded on the specimen.

Given specimens having sufficient electrical conductivity, the specimen current deriving from the ion beam current and the charged secondary particle currents emitted from the specimen flows off to ground via the specimen support and the voltage source. The specimen support can be placed at an electric potential optimum for the investigation of the specimen surface with the assistance of the voltage source via which the specimen current flows to ground.

Given specimens having poor conductivity, for example given insulators (oxides, nitrides, glasses, etc), the specimen current deriving from the ion beam current and the charged secondary particle currents emitted by the specimen can only flow off via the very-high electrical resistance of the specimen or, respectively of the specimen surface itself. Due to charging effects on the area of the specimen struck by the ion beam, extreme shifts in potentials can arise, these potential shifts potentially inhibiting or completely preventing the emission and/or the transfer of secondary ions into the mass spectrometer.

When the ion beam consists of positively charged ions, then the surface charging will frequently also be positive and can then be compensated, in principle, by simultaneous bombardment with electrons. It is known from the art to bombard the specimen with a standing electron beam which has a relatively large diameter of its focal spot on the order of about 1 millimeters. As a result thereof, it is usually possible to register secondary ion signals from insulator surfaces.

This known method for the compensation of charges in secondary ion mass spectrometry, however, no longer meets the growing requirements made of the quality, for example of the reproducibility of the test results. The reason for this is that the shape and the point of incidence of the ion beam and of the electron beam deviate too greatly from one another. As a consequence thereof, the electron current density at the various points of incidence of the ion beam during its scan pass is not constant and the uniform compensation of charges for the entire sputter area on the specimen is therefore not achieved.

A further deficiency of this procedure is that negative charges are generated at all locations impinged by the electron beam but not currently impinged by the ion beam, the field of the negative charges having a negative effect on the transfer of the secondary ions triggered later on by the ion beam into the mass spectrometer and therefore falsifying the test result.

In addition, finally, given this known method for the compensation of charges in secondary ion mass spectrometry is the disadvantage that the inherently unnecessary and undesired electron irradiation of those zones on the surface of the specimen momentarily not impinged by the ion beam, these having to be sputtered with the assistance of the ion beam, can induce undesired effect of specimen modifications such as, for example, diffusion and desorption.

SUMMARY OF THE INVENTION

The object of the present invention, therefore, is to provide a method and an apparatus of the type generally set forth above which allows secondary ion mass spectra of specimens having poor electrical conductivity to be recorded under better defined conditions than has been heretofore possible.

The object of the invention is achieved by a method in which the electron beam of the electron gun is focused to approximately the same diameter as the ion beam, whereby the electron beam impinges approximately the same point on the surface of the specimen as the ion beam.

The above object is also achieved by an apparatus which utilizes an ion gun and an electron gun which share a common scan generator.

The method and the apparatus of the present invention lead to an improved compensation of charges in the secondary ion mass spectrometry of specimens having poor electrical conductivity. The method sees to it that the point of incidence of the electron beam on the specimen approximately coincides with the point of incidence of the ion beam at any point in time.

The method of the invention and the apparatus of the invention provide that an electron gun is employed which allows a focusing of the electron beam to approximately the same diameter as exhibited by the ion beam. For example, an electron gun such as utilized in traditional devices for Auger Electron Spectrometry can be employed for this purpose.

Advantageously, the electron beam is synchronously scanned with the ion beam in that the deflection voltages for both electron beam and the ion beam are controlled, in common, by the same scanning generator. It is merely the amplification of the output voltages of the scanning generator to the required deflection voltages for the ion beam and for the electron beam which occurs, if necessary, by way of separate d.c. amplifiers.

An approximately congruent scanning of both beams is enabled by superposing d.c. voltage components and by the possibility of attenuating the output voltages of the scanning generator insofar as they are employed for the deflection of the electron beam.

Advantages of the method and apparatus of the invention are, for example, the reproducibility of the compensation charges in secondary ion mass spectrometry and, therefore, the reproducibility of the measurements, the gentle treatment of the specimen and avoiding local charges due to the electron beam.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
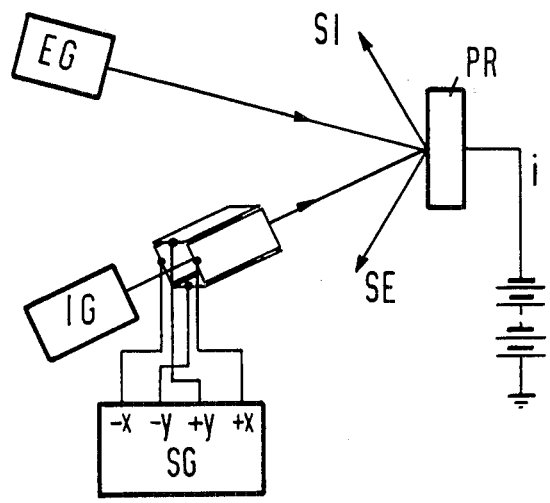
FIG. 1 is a schematic representation of the principle of an apparatus for the compensation of electrical charges for SIMS measurements according to the prior art.

FIG. 1 illustrates the principle of a prior apparatus for the compensation of electrical charges given SIMS measurements. Given the analysis technique of secondary ion mass spectrometry (SIMS), an ion beam generated in an ion gun IG is scanned line-by-line across a specimen PR in a known manner and a sputter crater is thereby generated in the specimen. The ionized erosion products thereby arising, namely the secondary ions SI, are supplied to a mass spectrometer and analyzed. A so-called depth profile for the appertaining chemical element with respect to the specimen PR is obtained by registering the signal intensity of an ion type as a function of time. The secondary ions SI from the entire crater region or a center portion of it thereby contribute to the signal intensity. An apparatus a-DIDA of Atomika GmbH, Munich, Federal Republic of Germany, can, for example, be employed as the scanning ion beam device.

Upon incidence of the ion beam on the specimen PR, secondary ions SI and secondary electrons SE are released, among other things. When the specimen has poor conductivity, as in the case, for example, given insulators such as oxides, nitrides, glasses, etc, the specimen current i, deriving from the ion beam current and from the charged secondary ions SI and secondary electrons SE emitted by the specimen PR can only flow off via the very-high electrical resistance of the specimen PR or, respectively, of the specimen surface. Charges of the specimen PR on the area impinged by the ion beam there by arise, these charges inhibiting or entirely preventing the emission and/or the transfer of the secondary ions SI into the mass spectrometer.

For the compensation of electrical charges in SIMS measurements according to the art, the specimen PR is bombarded with a standing electron beam generated in an electron gun EG while the ion beam generated in the ion gun IG is scanned line-by-line across the specimen PR. The scanning of the specimen PR with the assistance of the ion beam is thereby controlled by a scanning generator SG. The signals are thereby communicated in a fashion known to those of ordinary skill in the art from the deflection generator SG to the deflection plate system DIG for the deflection of the ion beam. The deflection plate system DIG consists of two plate pairs for deflection in the x direction and, respectively, the y direction.

Figure 2:
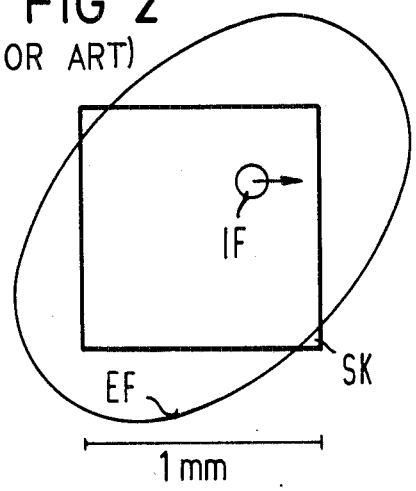
FIG. 2 is a plan view illustrating the principle of compensation charges given a method according to the prior art.

FIG. 2 illustrates the principle of the compensation of charges according to the known art. When the ion beam consists of positively charged ions, then the surface charge will likewise be positive and can therefore be fundamentally compensated by bombardment with electrons from an electron gun EG. A region on the surface of the specimen PR of about 1mm x 1mm to be investigated is indicated in FIG. 2 as a sputter crater SK. The sputter crater SK is scanned line-by-line by an ion beam whose focus IF migrates across the sputter crater SK line-by-line. Given the known method for the compensation of charges according to the art, the specimen PR is bombarded with a standing electron beam. Given this known method, the diameter of the focus EF of the electron beam amounts to about 1mm and thus covers the entire area of the sputter crater SK. With this known method, it is usually possible to register secondary ion signals from insulator surfaces. The fact that, given this known procedure, the focus EF of the electron beam practically constantly covers the entire sputter crater SK and that, therefore, the electron beam constantly influences the entire sputter crater SK, whereas the far smaller focus IF of the ion beam only scans the overall sputter crater SK line-by-line and thus covers subregions of the sputter crater SK for only a fraction of the entire scan time, produces inadequate test conditions and, therefore, inadequate test results.

Figure 3:
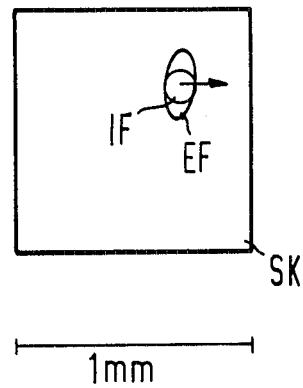
FIG. 3 is a plan view illustrating the principle for the compensation of charges according to the present invention.

FIG. 3 illustrates the principle of the present invention for the compensation of charges. The sputter crater SK has the same dimensions as in FIG. 2. The point of incidence EF of the electron beam on the specimen PR nearly coincides with the point of incidence IF of the ion beam at every point in time. The points of incidence EF of the electron beam and IF of the ion beam scan together within the sputter crater SK and simultaneously scan the sputter crater SK line-by-line. The advantages of the invention, of course, are likewise already achieved when the point of incidence EF of the electron beam is chronologically and/or spatially offset slightly with respect to the point of incidence IF of the ion beam. What is of significance for the method and apparatus of the invention is that the electron beam and the ion beam simultaneously scan the sputter crater SK and always with approximately identical points of incidence.

Figure 4:
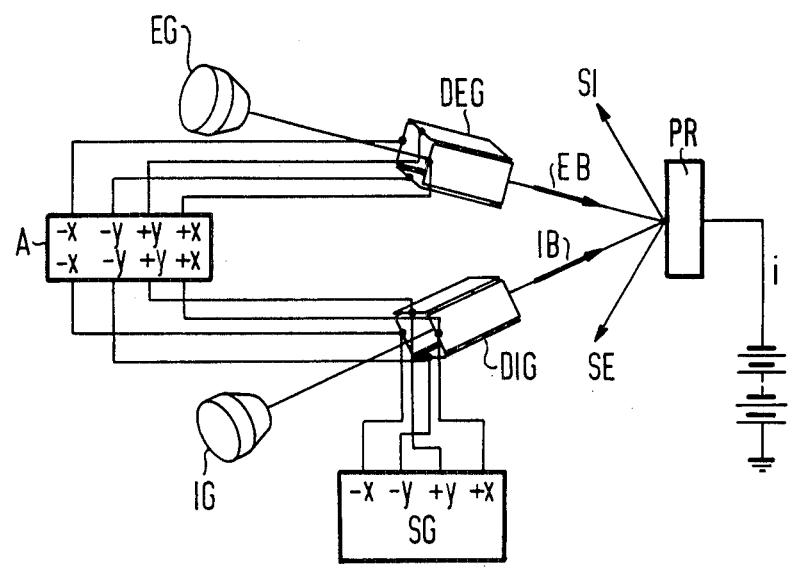
FIG. 4 is a schematic representation of the principle of apparatus for the compensation of electrical charges in SIMS measurements according to the present invention.

FIG. 4 illustrates the principle of apparatus constructed in accordance with the invention for the compensation of electrical charges for SIMS measurements. An electron gun of the type built into commercially-available scanning Auger microprobes can, for example, be employed as the electron gun EG. The electron beam EG and the ion beam IB are advantageously synchronously scanned in that the deflection voltages of both beams EB, IB are controlled in common by the same scanning generator SG. A scanning generator SG which is thereby useable is built into the aforementioned device of the Atomika company as well as into any other SIMS device. Since the electron gun EG and the ion gun IG are disposed at different locations, the electron beam EG generally impinges the specimen PR at a different angle than is the case for the ion beam IB. The possibility of adjustably attenuating the output voltages of the scanning generator SG is provided in an auxiliary device (amplifier) A in order to adjust the position of the electron beam EB and in order to correct the difference in the angles of incidence of the ion beam IB and the electron beam EB. The x attenuation can thereby be different than the y attenuation and these attenuations can additionally depend in every surface coordinate on the respectively other coordinate. In addition, the output voltages of the device A can be superimposed by selectable d.c. voltages in order to assure that the electron beam EB will scan the sputter crater SK in common with the ion beam IB.

For the deflection of the electron beam EB, the same deflection signals that are communicated from the deflection generator (scan generator) SG to the deflection plate system DIG for the ion beam IB are applied to the inputs of the auxiliary device (amplifier) A. These deflection signals of the scan generator SG can be adjustably attenuated or amplified in the described manner in the auxiliary device A. The usually attenuated or, respectively, amplified deflection signals of the scanning generator SG available at the output of the auxiliary device A are then employed for the drive of the further deflection plate system DEG. This second deflection plate DEG serves for the deflection of the electron beam EB and corresponds in its operational mode to the deflection plate system DIG which serves for the deflection of the ion beam IB. The modification of the deflection signals of the scan generator SG in the auxiliary device A and the communication of these deflection signals modified in the auxiliary device A to the deflection plate system DEG effect that the point of incidence of the electron beam EB on the specimen PR approximately coincides with the point of incidence of the ion beam IB on the specimen at any point in time and that the points of incidence of the electron beam EB and of the ion beam IB within the sputter crater SK scan the sputter crater SK line-by-line in common and simultaneously.

It is advantageous, in order to compensate the charges as well and as permanently as possible to automatically regulate the strength of the electron beam current. Either a specimen-associated reference signal such as, for example, a secondary ion signal or the specimen current i flowing from the specimen PR via the specimen support serves as the measurable variable in this regulation. The specimen current i should thereby become as small as possible and completely disappear in the ideal case.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method of compensating charges in secondary ion mass spectrometry, comprising the steps of:
   focusing an ion beam and an electron beam to approximately the same diameter;
   directing the ion beam and the electron beam to approximately the same point on a surface of a specimen; and
   scanning the ion beam and the electron beam synchronously over an area of the specimen.

2. The method of claim 1, wherein the step of scanning is further defined as:
   controlling the ion beam and the electron beam with a scan generator in common thereto.

3. The method of claim 3, wherein the step of controlling is further defined as:
   controlling congruent scanning by generating and applying to respective deflection systems for the beams respective deflection voltages.

4. The method of claim 3, wherein the step of controlling is further defined as:
   generating ion beam deflection voltages and applying the same to a deflection system for the ion beam; and
   generating and superposing d.c. voltages on the ion beam deflection voltages and applying the same to a deflection system for the electron beam.

5. The method of claim 3, wherein the step of controlling is further defined as:
   generating ion beam deflection voltages and applying the same to a deflection system for the ion beam; and
   amplifying the ion beam deflection voltages and applying the same to a deflection system for the electron beam.

6. The method of claim 4, wherein the step of controlling is further defined as:
   generating ion beam deflection voltages and applying the same to a deflection system for the ion beam; and
   attenuating the ion beam deflection voltages and applying the same to a deflection system for the electron beam.

7. Apparatus for compensating charges in secondary ion mass spectrometry, comprising:
   an ion gun generating an ion beam focused to a predetermined diameter;
   an electron gun generating an electron beam focused to approximately the predetermined diameter;
   an ion beam deflection system;
   an electron beam deflection system; and
   scan means connected to said ion beam deflection system and to said electron beam deflection system and operable to cause synchronous common scanning of said beams over a surface of a specimen.

8. The apparatus of claim 7, wherein said scan means comprises:
   a scan generator operable to produce deflection voltages for one of said deflection systems; and
   modifying means for modifying the deflection voltages for the other of said deflection systems.

9. The apparatus of claim 8, wherein said modifying means comprises:
   superposition means for superimposing d.c. voltages on said deflection voltages.

10. The apparatus of claim 8, wherein said modifying means comprises:
    means for amplifying said deflection voltages.

11. The apparatus of claim 9, wherein said modifying means comprises:
    means for attenuating said deflection voltages.

12. The apparatus of claim 8, wherein each of said deflection systems comprises an x-y deflection system and wherein said modifying means comprises:
 means for amplifying the deflection voltages with an amplification factor such that the deflection voltage for one deflection direction is modified in response to the actual generated deflection voltage for the other deflection direction to compensate for the different viewing directions of both guns relative to the surface of the specimen.

13. The apparatus of claim 8, wherein each of said deflection system comprises an x-y deflection system and wherein said modifying means comprises:
 means for attenuating the deflection voltages with an attenuation factor such that the deflection voltage for one deflection direction is modified in response to the actual generated deflection voltage for the other deflection direction to compensate for the different viewing directions of both guns relative to the surface of the specimen.

14. The apparatus of claim 7, and further comprising:
 electronic means responsive to the sample current flowing to ground for rapid regulation of the electron beam on each subarea of the sputter crater during the scan of both coinciding beams for reducing the sample current to zero.

* * * * *